United States Patent [19]

Willis

[11] 4,234,827
[45] Nov. 18, 1980

[54] REGULATED DEFLECTION CIRCUIT WITH REGULATOR SWITCH CONTROLLED BY DEFLECTION CURRENT

[75] Inventor: Donald H. Willis, Indianapolis, Ind.

[73] Assignee: RCA Corporation, New York, N.Y.

[21] Appl. No.: 58,659

[22] Filed: Jul. 19, 1979

Related U.S. Application Data

[63] Continuation of Ser. No. 926,337, Jul. 20, 1978.

[51] Int. Cl.³ .................... H01J 29/70; H01J 29/76
[52] U.S. Cl. .................................... 315/408; 315/399
[58] Field of Search ............... 315/408, 399, 411, 409, 315/410; 358/190

[56] References Cited

U.S. PATENT DOCUMENTS

| | | | |
|---|---|---|---|
| 3,434,003 | 3/1969 | Geller | 315/408 |
| 3,832,592 | 8/1974 | Dietz | 315/408 |

Primary Examiner—Theodore M. Blum
Attorney, Agent, or Firm—Eugene M. Whitacre; Paul J. Rasmussen; Joseph J. Laks

[57] ABSTRACT

A source of unregulated direct voltage has a terminal coupled to a capacitor. A horizontal deflection circuit is coupled to a first terminal of the source and to the capacitor so as to be energized by a regulated voltage established by the difference between the unregulated voltage and the voltage across the capacitor. The deflection switching transistor is serially coupled with an additional controllable switch, and an inductor is coupled between the junction of the switches and the second terminal of the source of unregulated direct voltage to provide a controllable path for current flow in the capacitor. The controllable switches are operated at the deflection rate to generate deflection currents and to control the state of charge of the capacitor to maintain a constant regulated voltage. The energy represented by periodic discharge of the capacitor is recovered.

12 Claims, 5 Drawing Figures

REGULATED DEFLECTION CIRCUIT WITH REGULATOR SWITCH CONTROLLED BY DEFLECTION CURRENT

This is a continuation, of application Ser. No. 926,337, filed July 20, 1978.

This invention relates to switching regulators for television deflection circuits.

Television display devices form images in a raster scanned upon the face of a kinescope. A high-speed horizontal trace is scanned, and the horizontal line thus produced is scanned vertically at a lower speed. The horizontal deflection requires a relatively large power. The power requirements are minimized by utilizing a resonant scanning system in which a switch associated with the resonant elements is periodically operated in synchronism with the video to be displayed. The circulating energy in such resonant scanning systems and consequently the width of the scanned raster depends upon the magnitude of the direct operating voltage applied to the deflection circuit.

The unregulated direct voltage obtained by rectification from the power mains varies widely from place to place and from time to time. It is desirable to prevent the raster size from changing, and voltage regulators are often used for this purpose. Switching-type voltage regulators have found increasing use in television devices because of their reduced power consumption compared with linear regulators. A switching regulator using an SCR or thryristor as the switching device is described in U.S. Pat. No. 3,970,780 issued July 20, 1976 in the name of Minoura. In the Minoura arrangement, a source of unregulated direct potential is coupled by means of an inductor, a winding and an SCR to a filter capacitor across which the regulated operating voltage for the horizontal deflection system is formed. A control circuit senses the regulated voltage and gates the SCR on at a time during each horizontal deflection interval which is varied in order to maintain the voltage being regulated. In the Minoura arrangement, a flyback pulse cupled from the deflection circuit to the winding reverse-biases the SCR to turn it off preparatory for the next cycle. It is desirable to eliminate this winding.

SUMMARY OF THE INVENTION

A deflection circuit with switched regulator adapted for operation from a source of unregulated direct voltage includes a deflection winding. An input inductor is serially coupled between a first terminal of the source and one end of the deflection winding to form a series circuit. A capacitor is coupled between the other end of the deflection winding and a terminal of the source so the voltage across the series circuit is regulated by the difference between the unregulated voltage and the voltage across the capacitor. A first controllable switch is coupled with the series circuit and is operated at the deflection rate to set up currents in the deflection winding during trace and retrace intervals. A second controllable switch is serially coupled with the first controllable switch. A second inductor is coupled between the junction of the first and second switches and the second terminal of the source to provide a path for the flow of current in the capacitor. A control circuit controls the deflection and the conduction period of the first and second switches to control the flow of current in the capacitor through the second inductance and maintain the regulated voltage substantially constant.

DESCRIPTION OF THE INVENTION

Figure 1:
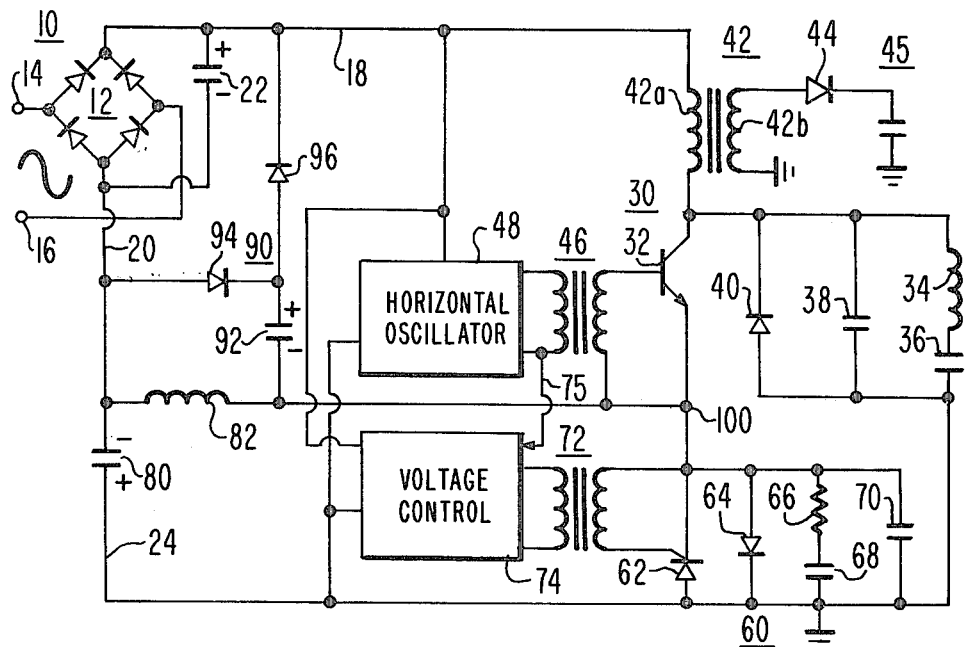
FIGS. 1, 3 and 4 are diagrams in block and schematic form of various embodiments of the invention.

Generally speaking, FIG. 1 illustrates at the left a power supply 10 acting as a source producing unregulated direct voltage on conductors 18 and 20. At the right, a horizontal deflection circuit designated generally as 30 is coupled between conductor 18 at the top of the FIGURE and conductor 24 at the bottom. A capacitor 80 is coupled between conductors 20 and 24 and is effectively in series with horizontal deflection circuit 30 across the source of unregulated direct voltage. A controllable regulator switch designated generally as 60 at lower right is serially coupled with horizontal output transistor 32. A regulated direct voltage is formed between conductors 18 and 24 which is less than the unregulated direct voltage (deboost).

Power supply 10 includes a bridge rectifier designated generally as 12 having input terminals 14 and 16 coupled to the alternating power line. Rectifier 12 produces pulsating direct current on conductors 18 and 20 which is filtered by a capacitor 22 to form the unregulated direct voltage energizing the remainder of the circuit. The voltage on conductor 18 is positive relative to conductor 20. An NPN horizontal output transistor 32 acting as a first controllable switch has its collector coupled to conductor 18 by the primary winding 42a of a transformer 42, which serves as an input inductance for deflection circuit 30. A secondary winding 42b of transformer 42 is coupled to power supply designated generally as 45 including a rectifier represented as a diode 44. Power supply 45 produces direct operating voltage for other portions of the television device, not shown. A deflection winding 34 is serially connected with an S-correction capacitor 36, and the series combination is connected at one end to the collector of transistor 32. A retrace capacitor 38 is paralleled with the series combination of deflection winding 34 and capacitor 36. A damper rectifier or diode 40 is coupled in parallel with capacitor 38. The other end of the series combination of winding 34 and capacitor 36 is coupled to conductor 24, which in the embodiment of FIG. 1 also serves as reference ground.

The emitter of horizontal output transistor 32 is connected to a junction 100. Junction 100 is coupled to ground by the main current conducting path of a second controllable switch 60. Switch 60 includes an SCR 62 the anode of which is grounded and the cathode of which is connected to junction 100. A diode 64 is antiparalleled with SCR 62 to provide bidirectional switch conduction. A snubber arrangement including a capacitor 70 paralleled with the series combination of a resistor 66 and a capacitor 68 is coupled across diode 64 for reducing switching transients.

Junction 100 is coupled to conductor 20 by an inductor 82. An energy recovery circuit designated generally as 90 includes a capacitor 92 having one end connected to junction 100 and the other end connected to the cathode of a diode 94, the anode of which is connected to conductor 20. The cathode of diode 94 is connected to the anode of another diode 96, the cathode of which is connected to conductor 18.

The base of transistor 32 is driven from a horizontal oscillator 48 by means of a transformer 46. Horizontal oscillator 48 is energized by the voltage between conductor 18 and ground and is synchronized by a source of horizontal synchronizing signals, not shown. The gate of SCR 62 is coupled to a voltage control circuit 74 by means of a transformer 72. Voltage control circuit 74 is energized by the voltage between conductor 18 and ground. Voltage control 74 receives drive pulses from oscillator 48 over a conductor 75 for synchronizing the gating of SCR 62 with the horizontal deflection. Voltage control 74 time-modulates gating pulses for SCR 62 in known manner to maintain the voltage between conductors 18 and 24 constant. This time modulation is of the type sometimes known as pulse-position modulation because an amplitude-time graph of the recurrent pulses changes the horizontal position of the pulses as a function of modulation. Since only the leading edge of the pulse is effective in producing gating of SCR 62, other forms of pulse-time modulation may also be used.

When alternating current is first applied to terminals 14 and 16, capacitor 22 charges and the unregulated voltage appears thereacross. In the absence of gating pulses for transistor 32 or SCR 62, little current flows in capacitor 80, and there is no voltage difference between its plates. Thus, no voltage difference exists between conductors 20 and 24 and consequently the unregulated voltage appears between conductors 18 and 24 to energize horizontal oscillator 48 and voltage control circuit 74. Horizontal oscillator 48 begins to produce pulses, horizontal output transistor 32 is periodically rendered conductive and current flows from capacitor 22 through the path including primary winding 42a, the collector-emitter path of transistor 32, diode 64 and capacitor 80, causing capacitor 80 to charge in the polarity shown. This reduces the voltage between conductors 18 and 24 by the voltage across capacitor 80. As the horizontal deflection circuit continues to operate, the voltage across capacitor 80 will increase sufficiently that the voltage between conductors 18 and 24 will be at the desired value. Further increase in the voltage across capacitor 80 will cause the voltage across conductors 18 and 24 to become less than the desired value. In order to control the voltage at capacitor 80 to maintain the regulated voltage between conductors 18 and 24 constant, capacitor 80 is controllably discharged during each horizontal deflection interval by the path including switch 62 and inductor 82. In normal operation immediately prior to each recurrent retrace interval, transistor 32 and diodes 64 and 96 are conductive. The deflection winding current I34 is nearing a maximum as illustrated in FIG. 2b under the impetus of the voltage across capacitor 36, and is flowing through the collector-emitter path of transistor 32 to junction 100. Also, the current in inductive winding 42a is also nearing a maximum and flows through the collector-emitter path of transistor 32 to junction 100. With diode 64 conductive, the voltage across capacitor 80 is impressed across inductor 82 and the current I82 in inductor 82 approaches a maximum, as illustrated in FIG. 2j, immediately before time T0 of the beginning of retrace. Diode 64 conducts the difference between the sum of the currents in windings 34 and 42a and the current in inductor 82. A portion of the current flowing through diode 64 returns to capacitor 36, and the remainder flows through capacitor 80, increasing its charge and the voltage thereacross. With diode 64 conductive, junction 100 is nominally at zero volts but is actually one Vbe positive with respect to ground.

At time T0, oscillator 48 turns OFF transistor 32, preventing further flow of current to junction 100. This initiates the retrace interval. In the interval between time T0 and T1, representing the first half of the retrace interval, the collector voltage of transistor 30 increases in a sinusoidal manner as illustrated by VC32 of FIG. 2a and the current in winding 34 flows as illustrated by I34 in FIG. 2b in a resonant path including retrace capacitor 38. The energy stored in the magnetic field associated with inductor 82 tends to maintain the current in inductor 82, forming a back EMF which makes junction 100 negative with respect to ground as illustrated by V100 of FIG. 2h. Thyristor 62 is thereby forward biased but is not conductive in the absence of a gating pulse. The decrease in voltage at junction 100 is coupled to diode 94 by capacitor 92 and causes diode 94 to become conductive and maintain a decreasing current flow in a circulating current path including inductor 82, diode 94 and capacitor 92 as illustrated by I92 of FIG. 2k. In this manner, the energy stored in inductor 82 at the beginning of the retrace interval is transferred to capacitor 92 preparatory to recovery.

At time T1, the retrace voltage reaches a peak as the energy of windings 34 and 42a is transferred to capacitor 38, and the sum of the current in windings 34 and 42a goes to zero. The high voltage across capacitor 38 causes the current in windings 34 and 42a to begin to increase in the reverse direction as illustrated by I34.

Figure 2:
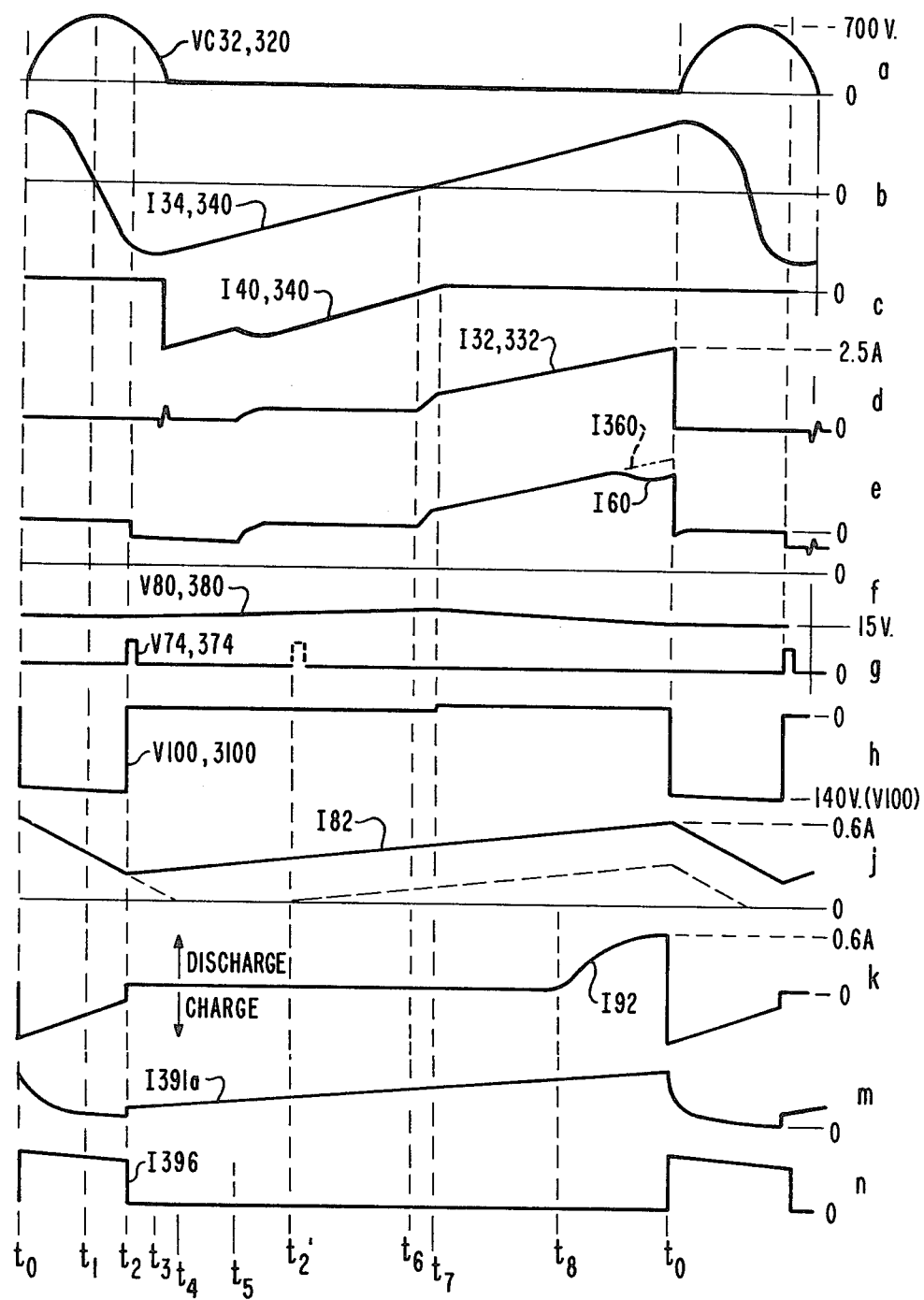
FIGS. 2 and 5 illustrate as amplitude-time graphs the periodic voltage and current waveforms occurring in the circuits of FIGS. 1, 3 and 4.

Voltage control 74 produces a gating pulse V74 at a time T2 as illustrated in FIG. 2g. Time T2 as shown in FIG. 2 is illustrative and may range from time T0 to time T6 of the center of the scanning interval. Gating pulse V74 gates thyristor 62 into conduction. With SCR 62 conductive, junction point 100 is coupled to ground and its voltage V100 rises to nominal zero volts as illustrated in FIG. 2h. At the same time, the voltage across capacitor 80 is once again impressed across inductor 82, causing its current I82 to once again begin to increase. The increasing current in inductor 82 is supplied by capacitor 80. The discharge of capacitor 80 reduces the voltage across the capacitor, as illustrated by V80 of FIG. 2f. Also at time T2, the sharp increase in voltage at junction 100 reverse-biases diode 94 and stops the charging of capacitor 92, as illustrated by I92 of FIG. 2k.

The retrace interval ends at time T3 as the collector voltage of transistor 32 decreases to nominal zero volts and damper diode 40 conducts the deflection current as illustrated by I40 of FIG. 2c. In the interval between time T2 and time T5, switch 60 conducts the increasing current in inductor 82, as illustrated by I60 of FIG. 2e. In FIG. 2e, currents negative with respect to zero represent currents flowing in SCR 62 and positive currents represent currents flowing in diode 64. Time T5 represents the time before the center of the scanning interval at which horizontal output transistor 32 is initially supplied with base drive. At time T5, diode 40 is conductive and the collector of transistor 32 is approximately 1 Vbe below ground. SCR 62 is also conductive at time T5, and junction 100 will be negative with respect to ground by the forward drop of the SCR, which somewhat exceeds 1 Vbe. Consequently, transistor 32 is biased for normal transistor action and conducts as illustrated by I32 of FIG. 2d when supplied with base drive. At time T5, transistor 32 takes over conduction from SCR 62 and supplies current to inductor 82, which increases the flow of current I40 in damper 40 by the amount of current flow in inductor 82.

In the interval between times T5 and time T6 of the center of the horizontal scanning interval, deflection current I34 decreases, damper current I40 decreases and current in inductor 82 increases, albeit at a lower rate. Also in the interval between times T5 and T6, the current in winding 42a reaches zero, reverses and begins to flow through the collector-emitter path of transistor 32 to junction 100.

Near time T6 of the center of horizontal scan, deflection current I34 decreases to zero, and reverses. With deflection winding current I34 zero and the current in winding 42a small, damper diode 40 must remain conductive to supply the current in winding 82 by way of transistor 32 and capacitor 80. The sum of the currents in windings 34 and 42a increases more quickly than the current in inductor 82, however, and the current in damper diode 40 is quickly reduced to zero at a time T7. Immediately after time T7, the sum of the currents in windings 34 and 42a exceeds the requirements of inductor 82, and the voltage at junction 100 rises sharply to 1 Vbe above ground at which time diode 64 of switch 60 becomes conductive. This relatively small change in voltage at junction 100 has a negligible effect upon the rate of rise of current in inductor 82, and in windings 34 and 42a. The excess of the current entering junction 100 from transistor 32 over that required for inductor 82 passes through diode 64. The excess of the current through diode 64 over that required by deflection winding 34 and capacitor 36 charges capacitor 80 as can be seen by reference to FIG. 2f. Capacitor 80 continues to charge through diode 64 until the end of the horizontal scanning interval.

With switch 60 conductive, the voltage across energy recovery diode 96 can be established by starting from conductor 20 and noting that the anode voltage of diode 96 is the sum of the voltages on capacitors 80 and 92 and the forward voltage drop across diode 64. The voltage on the cathode of diode 96 is the voltage across capacitor 22. The voltage across the diode is the difference between the anode and cathode voltages. At time T8, the voltage across capacitor 80 together with the additional forward voltage drop of diode 64, has increased to a value at which diode 96 becomes conductive. With diode 96 conductive, some of the current entering junction 100 through transistor 32 is diverted away from diode 64 and flows instead to capacitor 92, as can be seen in FIG. 2k. This additional current discharges capacitor 92 and transfers part of its energy to capacitor 22 until the time T0 of the next following retrace interval. At time T0, transistor 32 becomes nonconductive, causing the voltage at junction 100 to take a negative value, thereby turning off diode 64 and 96 and turning on diode 94 to transfer energy stored in inductor 82 to capacitor 92 preparatory for the next recovery cycle.

As described, capacitor 80 begins to discharge through inductor 82 at a time T2 which may be varied under the control of voltage control circuit 74. The discharge of capacitor 80 stops after time T7, when current entering junction 100 from winding 42a through transistor 32 exceeds the current in inductor 82, at which time capacitor 80 again begins to charge. In the interval between the beginning of the retrace interval and time T2 at which SCR 62 is gated into conduction, capacitor 80 is neither charged nor discharged through switch 60. Time T2 is varied in order to control the regulated voltage appearing between conductors 18 and 24 and representing the algebraic sum of the voltages on capacitors 22 and 80. If the regulated voltage is too great, capacitor 80 has insufficient voltage and must be charged. This is accomplished by delaying time T2 at which SCR 62 is gated into conduction to some later time such as T2', as illustrated in FIG. 2g. This has the effect of temporarily reducing the current in inductor 82 as shown by the dotted lines in FIG. 2j and thereby reduces the discharge current of capacitor 80. The charging of capacitor 80, however, is not significantly affected, with the result that capacitor 80 over several horizontal lines assumes a greater charge and produces a voltage which when summed with the voltage across capacitor 22 restores the regulated voltage. Similarly, for a regulated voltage which is too low, time T2 can be advanced to increase the discharge of capacitor 80. It should be noted that a battery having terminals coupled to conductors 18 and 20 could be substituted for power supply 10.

Figure 3:
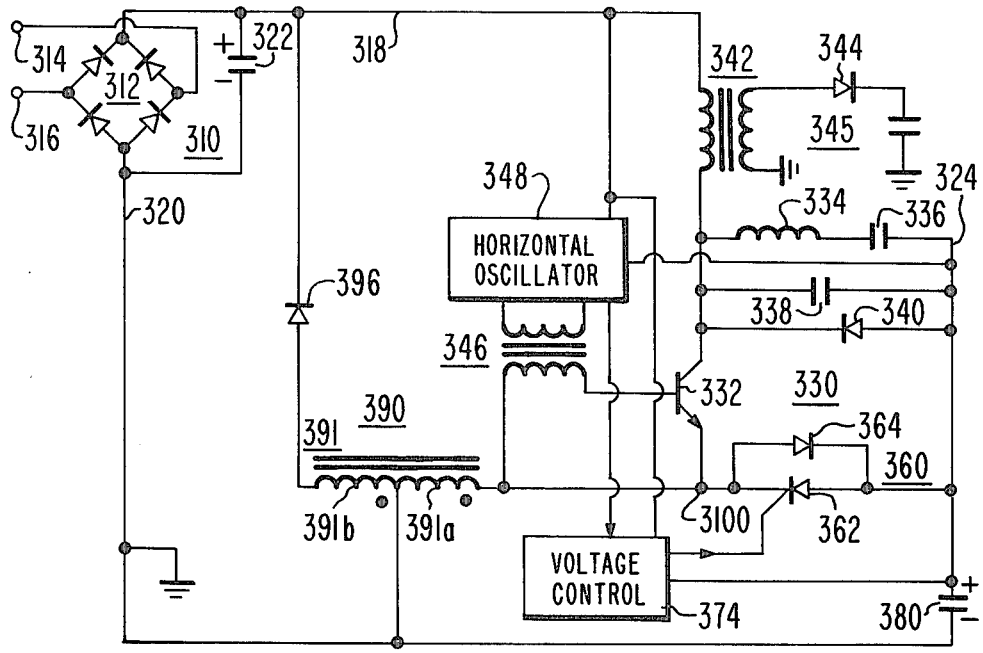

Components of FIG. 3 corresponding to those of FIG. 1 are designated by the same number with the prefix 3. The circuit of the embodiment of FIG. 3 differs from that of FIG. 1 only in the arrangement of the energy recovery circuit 390 and in that conductor 320 has been taken as reference ground rather than conductor 324. Because the reference ground point in the arrangement of FIG. 3 has been moved, the polarity of voltage V380 as illustrated in FIG. 2f is reversed and the dc level of voltage V3100 of FIG. 2h is changed from that shown. Otherwise, FIGS. 2a through 2h exemplify operation of the circuit of FIG. 3.

In FIG. 3, one end of the primary winding 391a of the transformer 391 is coupled to junction point 3100 and the other end is connected to conductor 320. Primary winding 391a has n1 turns and serves the same purpose as winding 82 of the circuit of FIG. 1. That is, winding 391a serves as the discharge inductance for capacitor 380 under the control of the gating time of switch 360. The primary current of winding 391a is illustrated in FIG. 2m.

Transformer 391 also includes a secondary winding 391b having n2 turns magnetically coupled to winding 391. One end of winding 391b is coupled to conductor 320 and the other end is coupled by means of a diode 396 to conductor 318. Winding 391b and diode 396 serve the same purpose as diodes 94 and 96 and capacitor 92 of FIG. 1. That is, winding 391b and diode 396 serve to couple to capacitor 322 the energy which is stored in winding 391a immediately before the end of the trace interval.

In operation immediately before the end of the trace interval, transistor 332 and diode 364 are conductive. The excess of the current flowing to junction point 3100 from transistor 332 over that required for winding 391a and deflection winding 334 charges capacitor 380.

Retrace begins at time T0 and the deflection winding resonates with retrace capacitor 338. At the same time, the flux associated with winding 391a is supported by current flow in winding 391b, through diode 396 and capacitor 322. The unregulated voltage is applied across winding 391b, and the voltage at junction 3100 is therefore (minus) n1/n2 times the unregulated voltage. The current in winding 391b decreases as energy is given up to capacitor 322. During the interval in which diode 396 conducts, the current in diode 396 decreases as illustrated by I396 in FIG. 2n.

At time T2, SCR 362 is gated into conduction by voltage control 374 to begin a period in which capacitor 380 is discharged. With switch 360 conductive, the voltage across winding 391a equals that across capacitor 380 and the voltage at the anode of diode 396 decreases to (minus) n2/n1 times the capacitor 380 voltage. This turns off diode 396.

At a later time T5, the current through transistor 332 equals the current requirement of winding 391a and SCR 362 becomes nonconductive, and capacitor 380 continues to discharge through diode 340 and transistor 332. Capacitor 380 begins to charge at a time T7 near the center of the horizontal scanning interval and continues to charge until the beginning of the next succeeding retrace interval, as illustrated by I360 of FIG. 2e.

As in the case of FIG. 1, the arrangement of FIG. 3 allows regulation of the voltage appearing between conductors 318 and 324 by control of the voltage across capacitor 380. The voltage between conductor 324 and ground is not regulated, but is varied to maintain the regulated voltage constant.

Figure 4:
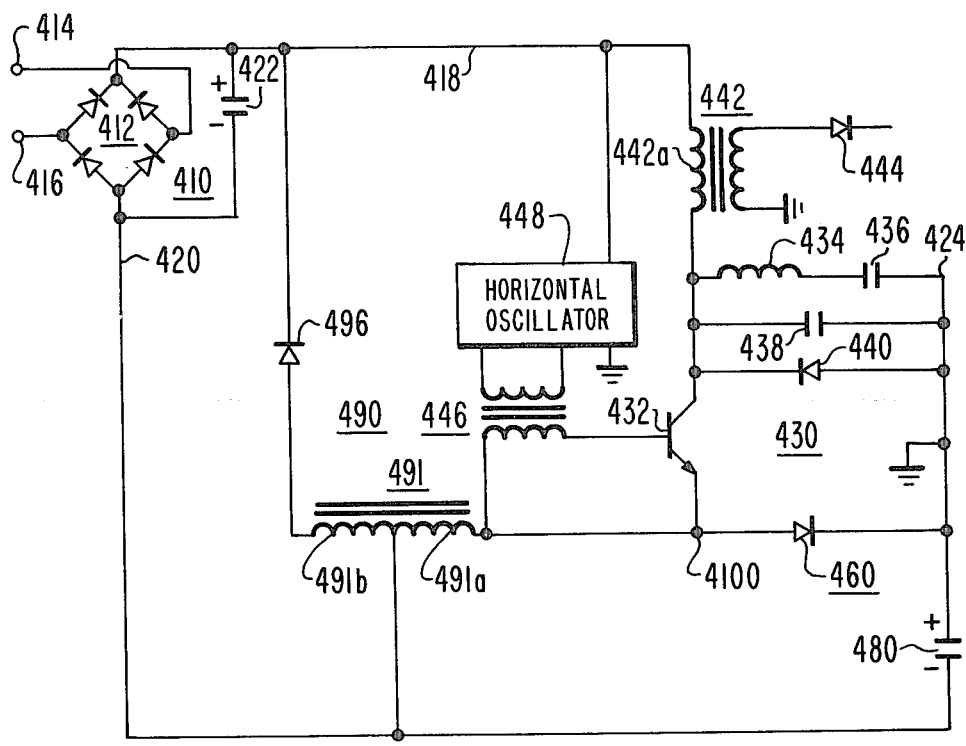

Components of FIG. 4 corresponding to those of FIG. 3 are designated by the same number with a prefix 4 rather than a prefix 3. The circuit of the embodiment of FIG. 4 differs from that of FIG. 3 only in the arrangement of the controlled switch and in that conductor 424 has been taken as reference ground rather than conductor 420. Horizontal oscillator 448 takes on a dual function in the arrangement of FIG. 4 and must be of the well-known type described in "A New Horizontal Output Deflection Circuit" by Peter Wessel, published in IEEE Transaction on Broadcast and Television Receivers, Vol. BTR 18, August 1972, pp. 177–182.

In FIG. 4, switch 460 includes a diode having its anode coupled to junction point 4100 and its cathode coupled to conductor 424. Diode 460 is controlled by the voltage between the junction point and conductor 424. The regulated voltage is formed between conductor 418 and conductor 424.

In operation immediately before time T0 of the beginning of retrace interval, horizontal output transistor 432 and diode 460 are conductive. Current in windings 434, 442a and 491a are near maximum and are increasing as illustrated by I434, I442a and I491a in FIGS. 5b, c and g, respectively. The collector-emitter conducting path of transistor 432 carries the sum of the currents of windings 434 and 442a to junction point 4100 as illustrated by I432 of FIG. 5f. That portion of the current entering junction 4100 which does not flow through winding 491a flows through switch diode 460 as illustrated by I460 of FIG. 5h. That portion of the current flowing in diode 460 which is in excess of the current of winding 434 flows in capacitor 480 as a charging current illustrated by I480 of FIG. 5j.

At time T0, the base drive supplied by horizontal oscillator 448 to transistor 432 is terminated, as illustrated by VB432 of FIG. 5e. Transistor 432 thereupon becomes nonconductive to initiate the retrace interval. In the succeeding retrace interval extending from time T0 to time T2, windings 434 and 442a resonate with retrace capacitor 438 to produce a retrace voltage pulse at the collector of transistor 432 illustrated by VC432 of FIG. 5a. During the retrace interval, energy recovery circuit 490 operates as described in conjunction with the circuit of FIG. 3, producing a current in diode 496 as illustrated by I496 of FIG. 5k.

At time T2 at which the retrace interval ends, conventional current flows to the right through winding 434 while charging capacitor 436, and returns by way of conductor 424 and damper diode 440. At the same time, conventional current flows through winding 442a to conductor 418 as winding 442a gives up energy to capacitor 422. The current in winding 442a flows in a circular path through conductor 418, capacitor 422, conductor 420, capacitor 480 and damper 440. Thus, the current in damper 440 is the sum of the current in windings 434 and 442a. Current flow in the circular path including winding 442a, capacitors 422 and 480 and damper 440 is in a direction to discharge capacitor 480 in an amount equal to the current in winding 442a, as illustrated by I480 of FIG. 5j.

During the first portion T2-T3 of the following horizontal scanning or trace interval, deflection current I434 decreases as the winding gives up its stored magnetic energy to S-capacitor 436, and the current in winding 442a decreases as the energy stored in its magnetic field is given up to capacitor 422. As a result, the current in damper 440 also decreases, as does the discharge current in capacitor 480.

Figure 5:
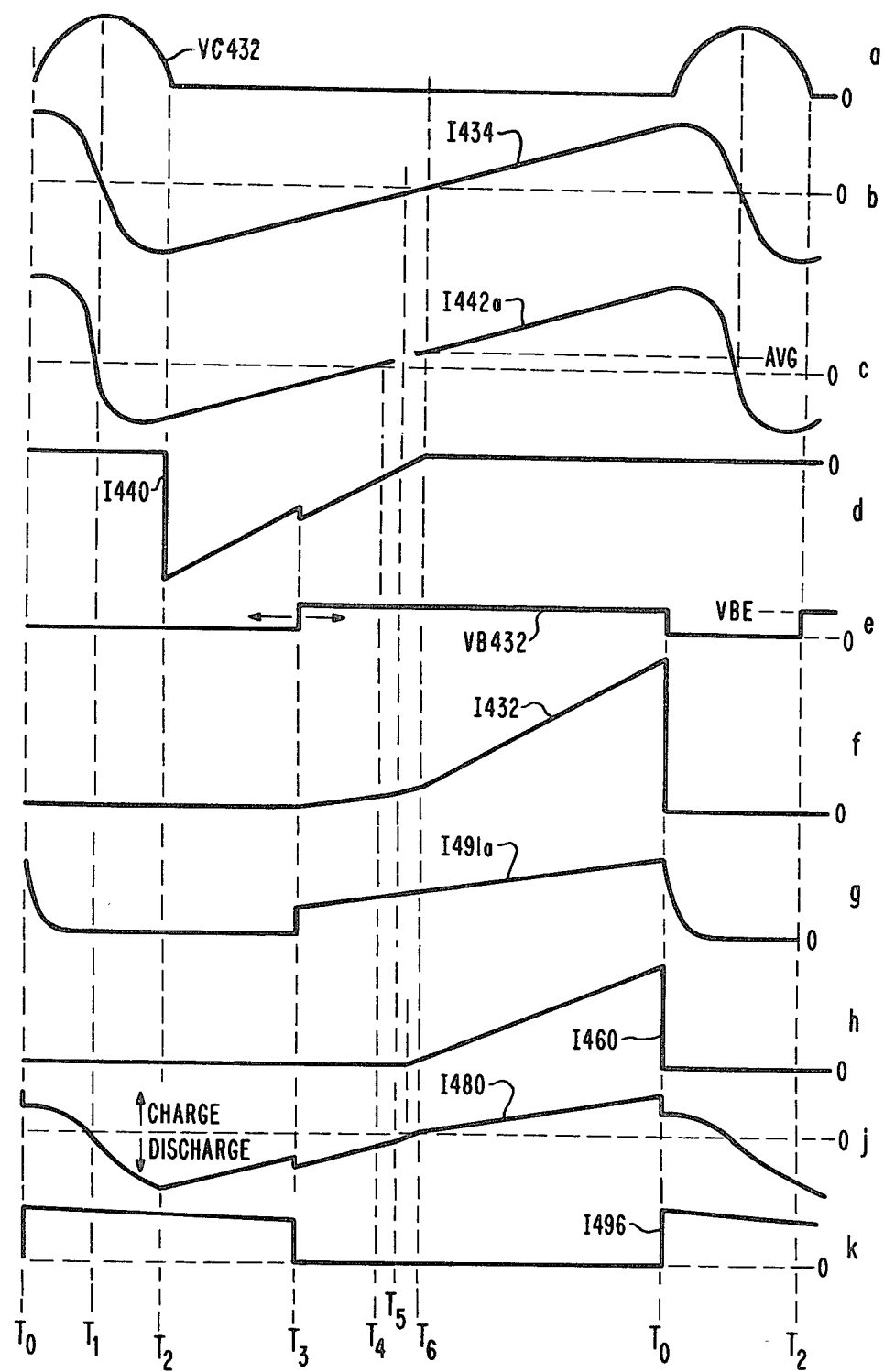

At a time T3, horizontal oscillator 448 produces a gating pulse VB432 which is coupled to the base of transistor 432 by transformer 446. Time T3 of FIG. 5 is selected rather arbitrarily for purposes of explanation, and may range as late as the center of horizontal scan or as early as immediately following the end of retrace.

At time T3, the collector-emitter path of transistor 432 becomes conductive and junction 4100 assumes a voltage negative with respect to ground by the forward voltage drop of damper 440 and the saturated collector-emitter voltage of transistor 432. This couples across winding 491a substantially the entire voltage then appearing across capacitor 480 and the current in winding 491b decreases to zero and the current in winding 491a begins to increase, but at a rate less than the rate of increase of the deflection current.

In the interval between times T3 and T6, representing the last portion of the first half of scanning interval, damper 440 carries the increasing current in winding 491a as well as the decreasing deflection current I434, as illustrated by I440 of FIG. 5d. At a time T4 before the center of horizontal scan, the conventional current I442a flowing upward through winding 442a decreases to zero, because of the average downward current flow necessary to make up for losses in the operation of the deflection circuit. Damper 440 remains conductive, carrying the deflection current and the current in winding 491a by way of transistor 432. That portion of the damper current flowing in winding 491a represents a net discharge of capacitor 480. After time T4, the current in winding 442a reverses and begins to flow downward. At a slightly later time T5, the increasing downward current flow in winding 442a equals the decreasing current flow in winding 434, whereupon damper 440 carries only the current flow of winding 491a.

Near time T6 of the center of the horizontal scanning interval, the increasing current in winding 442a equals the sum of the currents in windings 434 and 491a, and the net current flow in damper 440 is thereby reduced to zero. Damper 440 thereupon becomes nonconductive. During the second half of the scanning interval between times T6 and the time T0 of the beginning of the next following retrace interval, the deflection current in winding 434 reverses and increases under the impetus of the voltage across the S-capacitor. The deflection current flows through the collector-emitter path of transistor 432 together with the increasing current of winding 442a. The sum of these two currents enters junction 4100 and divides. That portion of the current entering junction 4100 not required by winding 491a flows through diode 460, and that portion of the current in diode 460 which does not return to S-capacitor 436 and winding 434 is available to charge capacitor 480. Alternatively, this may be viewed as a circulating current which does not charge capacitor 480 in the path including winding 434, transistor 432, didode 460 and capacitor 436 together with a current flow through winding 442a and transistor 432 to junction 4100, a portion of which is available to winding 491a and the remainder of which is available to charge capacitor 480. In any case, capacitor 480 charges and its voltage increases during the last half of the scanning interval. At the end of the scanning interval, transistor base drive pulse VB432 is terminated, and transistor 432 is turned OFF in order to initiate the retrace interval. Beginning at the start of the retrace interval, the energy stored in the magnetic field associated with winding 491a is returned to capacitor 422 as previously described, and a resonant energy transfer takes place between capacitor 438 and windings 434 and 442a preparatory for the next scanning interval.

As described, capacitor 480 discharges in the interval between times T3 and T6, which decreases its voltage and increases the regulated voltage appearing between conductors 418 and 424. During the last half of the horizontal scanning interval capacitor 480 charges, thereby decreasing the regulated voltage. It should be noted that the actual voltage change during each horizontal scanning interval may be made arbitrarily small by increasing the capacitance of capacitor 480, and that changes in the regulated voltage may be corrected over several horizontal cycles rather than during a single horizontal cycle. At some particular value of time T3, the net charge and discharge of capacitor 480 will sum to zero during each horizontal interval to maintain the regulated voltage constant. When the regulated voltage is too high, oscillator 448 sets time T3 later during the cycle, causing charge of capacitor 480 to predominate over discharge. This increases the voltage across capacitor 480, whereupon the regulated voltage representing the sum of the voltages across capacitors 422 and 480 decreases. Similarly, if the regulated voltage is too low, oscillator 448 sets time T3 closer to time T2 to reduce the difference between the regulated voltage and the desired voltage.

While the arrangement of FIG. 5 has the advantage of eliminating the SCR associated with switches 60 and 360, it has the disadvantage of requiring a horizontal oscillator 448 capable of producing horizontal output transistor gating pulses VB432 the leading edges of which are variable under the control of the voltage being regulated. Additionally, the range of control of the arrangement of FIG. 4 is not as great as that of the embodiments of FIGS. 1 and 3, because the flow of current in winding 491a can be started no earlier than the time T2 of the end of retrace, and therefore the maximum amount of energy which can be transferred out of capacitor 480 during each horizontal cycle is more limited than in the case of the other embodiments. In practical terms, this means that the deboost cannot be reduced as much as with the other arrangements and thus regulation ceases earlier under conditions of low unregulated directed voltage.

Other power supplies such as a battery may be substituted for circuit N10 (10,310 or 410) as described. Switch N60 may be a transistor antiparalleled with a diode. The arrangement of FIG. 4 may incorporate other energy recovery arrangements including the one described in conjunction with FIG. 1. An energy recovery scheme using a transformer winding such as winding 391 of FIG. 3 may be embodied with winding 391b connected to a reference voltage other than conductor 320, i.e., to conductor 324 or to a direct voltage produced by a power supply such as 345. Alternatively, the energy derived from the discharge of capacitor N80 (80,380 or 480) may be recovered by supplying a low-voltage portion of the television apparatus rather than recycling the energy back to the unregulated source, or the energy may not be recovered but dissipated as heat in a resistance.

Furthermore, the end of capacitor N80 remote from conductors N24 may be coupled to reference points other than those shown, such as for example conductors N18. With such a connection, the operation is fundamentally the same although the detailed description of the operation will not be the same, i.e., the charging of some capacitors may change to discharging. While in the embodiments shown the regulated voltage between conductors N18 and circuit point N100 is the difference between the unregulated voltage and the controllably varied voltage across capacitors N80, with the alternative capacitor connection the regulated voltage appears across capacitor N80 and is established by the unregulated voltage minus the controllably varied difference voltage.

What is claimed is:

1. A deflection circuit with switched regulator adapted for operation from a source of unregulated direct voltage, comprising:
   a deflection winding;
   input inductance means serially coupled between a first terminal of said source and a first end of said deflection winding to form a first series circuit;
   capacitance means coupled between a second end of said deflection winding and a second terminal of said source, the voltage across said first series circuit being regulated by the difference between said unregulated voltage and the voltage across said capacitance means;
   first controllable switch means coupled with said deflection winding and operated at the deflection rate for establishing currents in said deflection winding during periodic trace and retrace intervals;
   second controllable switch means serially coupled with said first controllable switch means at a first junction for providing a path for the flow of current in said first switch means;
   second inductance means coupled between said first junction and said second terminal of said source for providing a path for the flow of current in said capacitance means; and
   control means for controlling the deflection and for controlling the conduction period of said first and second switches in a manner to control the current flow in said capacitance means through said second inductance means and thereby maintain said regulated voltage substantially constant.

2. A circuit according to claim 1 further comprising damper means coupled across said deflection winding; wherein said second controllable switch means comprises rectifier means controlled by the voltage thereacross and coupled to said second end of said deflection winding;
   wherein said control means periodically renders said first switch means nonconductive to establish said retrace interval, and periodically renders said first switch means conductive at a time during the first half of said trace interval to control the flow of current in said second inductance means and thereby control the flow of current in said capacitance means to maintain said regulated voltage substantially constant.

3. A circuit according to claim 2 wherein said capacitance means is coupled between said second end of said deflection winding and said second terminal of said source, whereby the voltage across said first series circuit is the difference between said unregulated voltage and the voltage across said capacitance means.

4. A circuit according to claim 1 wherein:
said second controllable switch means comprises gated bidirectional switch means; and
said control means periodically operates said first controllable switch means to establish said trace and retrace intervals, and gates said gated bidirectional switch means into conduction during the interval extending from the beginning of each retrace interval to the center of the next succeeding trace interval to control the flow of current in said second inductance means and thereby control the current flow through said capacitance means to maintain said regulated voltage substantially constant.

5. A circuit according to claim 4 wherein said capacitance means is coupled between said second end of said deflection winding and said second terminal of said source whereby the voltage across said first series circuit is the difference between said unregulated voltage and the voltage across said capacitance means.

6. A circuit according to claim 4 wherein said gated bidirectional switch means comprises an SCR antiparalleled with a rectifier.

7. A circuit according to claims 2, 3 or 6 further comprising energy recovery means coupled with said source and with said second inductance means for returning to said source, energy stored by said second inductance means during discharge of said capacitance means.

8. A circuit according to claim 7 wherein said energy recovery means comprises:
third inductance means transformer coupled with said second inductance means, a first end of said third inductance means being coupled to a reference potential; and
second rectifier means coupling the second end of said third inductance means with said first terminal of said source, said second rectifier means being poled to allow current flow of such a polarity as to return energy to said source.

9. A circuit according to claim 7 wherein said energy recovery means comprises:
second capacitance means;
second rectifier means serially coupled with said second capacitance means at a second junction, the serial combination of said second capacitance means and said second rectifier means being coupled between said second terminal of said source and said first junction for providing an intermediate energy storage in said second capacitance means; and
third rectifier means coupled between said first terminal of said source and said second junction, said third rectifier means being poled for current flow of such a polarity as to return energy to said source.

10. A horizontal deflection circuit arrangement adapted to be operated from a source of unregulated direct voltage, comprising:
a deflection winding;
linearity capacitance means serially coupled with said deflection winding to form a first series circuit;
damper rectifier means coupled across said first series circuit to form a first parallel circuit;
input inductance means having one end coupled to a first end of said first parallel circuit and the other end coupled to a first terminal of said source of unregulated voltage.
first controlled unidirectional switch means operated at the deflection rate for defining periodic trace and retrace intervals;
second controlled bidirectional switch means serially coupled with said first switch means at a junction to form a second series circuit, said second series circuit being coupled in parallel with said first parallel circuit;
second capacitance means having one end coupled with a second end of said first parallel circuit and having the other end coupled to a second terminal of said source of unregulated voltage for establishing a stabilized direct operating voltage for the deflection circuit equal to the difference between said unregulated direct voltage and the voltage across said second capacitance means;
second inductance means having one end coupled to said junction and the other end coupled to said second terminal of said source of unregulated voltage for providing a current path for discharging said second capacitance means; and
energy recovery means coupled with said second inductance means and with said source of unregulated voltage for transferring the energy stored in said second inductance means to said source of unregulated voltage.

11. A self-regulating deflection circuit adapted to be energized by a source of unregulated direct voltage, comprising:
first and second controllable switch means, having first and second controllable current paths coupled in series at a first junction to form a first series combination, and having respective first and second control electrodes;
a deflection winding;
linearity capacitance means for coupling said deflection winding across said first series combination, to form a first parallel combination, said linearity capacitance means being serially coupled with said deflection winding;
first capacitance means coupled in series with said source of unregulated direct voltage and forming a second junction point therebetween, the end of said unregulated voltage source and of said first capacitance means remote from said second junction point forming terminals of a second source of direct voltage;
first inductance means coupling said first parallel combination across the terminals of said second source of direct voltage;
second inductance means coupling said first junction point with said second junction point; and
control means coupled with said first and second control electrodes for operating said first and second switch means for promoting the flow of deflection current at the deflection rate and for recurrently discharging said first capacitance means to thereby regulate the voltage of said second source.

12. A regulated deflection circuit, comprising:
a source of unregulated voltage;
a deflection winding;
a first capacitance coupled to said deflection winding;
a second capacitance coupled to said first capacitance and said source of unregulated voltage;
means for charging said first and second capacitances from said source of unregulated voltage;
inductance means;
switching means coupled to said deflection winding for applying a first voltage to said deflection winding during a trace interval for generating a deflection current in said deflection winding during said trace interval, said switching means coupling said inductance means to said second capacitance for providing a path for the flow of current in said second capacitance through said inductance means for controlling the voltage across said second capacitance, said first voltage being established as a value representative of the voltage difference between said unregulated voltage and the voltage maintained across said second capacitance; and
means responsive to a change in a voltage level within said deflection circuit for varying the current flow in said inductance means for varying the voltage across said second capacitance for regulating said voltage level.

* * * * *